(12) United States Patent
Ohashi

(10) Patent No.: US 6,749,930 B2
(45) Date of Patent: Jun. 15, 2004

(54) CORROSION-RESISTIVE MEMBERS

(75) Inventor: Tsuneaki Ohashi, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 100 days.

(21) Appl. No.: 09/982,542

(22) Filed: Oct. 18, 2001

(65) Prior Publication Data
US 2002/0109121 A1 Aug. 15, 2002

(30) Foreign Application Priority Data
Oct. 18, 2000 (JP) .................................. 2000-318125

(51) Int. Cl.$^7$ ............................. B32B 3/00; C04B 35/00

(52) U.S. Cl. ............................ 428/312.6; 428/312.8; 428/321.2; 428/901; 428/908.8; 501/97.1; 501/97.2; 501/97.3

(58) Field of Search ........................... 428/901, 307.3, 428/307.7, 315.7, 312.2, 312.6, 312.8, 908.8; 501/97.1, 97.2, 97.3

(56) References Cited

U.S. PATENT DOCUMENTS

| 4,954,232 A | * | 9/1990 | Yamada et al. | 204/192.23 |
|---|---|---|---|---|
| 5,382,273 A | * | 1/1995 | Mehrotra et al. | 51/307 |
| 5,744,410 A | * | 4/1998 | Komatsu et al. | 501/97.2 |
| 6,162,386 A | * | 12/2000 | Matsubara | 264/656 |
| 6,541,406 B1 | * | 4/2003 | Araki et al. | 501/97.2 |

* cited by examiner

Primary Examiner—Elizabeth M. Cole
Assistant Examiner—Hai Vo
(74) Attorney, Agent, or Firm—Burr & Brown

(57) ABSTRACT

A corrosion-resistive member is provided, including a corrosion-resistive face that is exposed to a corrosive gas causing ion bombardmemt. At least a part of the corrosion-resistive member is composed of a sintered silicon nitride body having an open porosity of not more than 5%. The sintered silicon nitride body constitutes the corrosion-resistive face, and if two auxiliary planes are formed by cutting the corrosion-resistive member to intersect vertically with the corrosion-resistive face and to be located vertically with respect to each other, the orientation index between the two auxiliary planes is in a range of 0.8 to 1.2, and the orientation index between the corrosion-resistive face and each of the auxiliary faces is at least 1.5.

8 Claims, 3 Drawing Sheets

SEM photograph of surface of test piece in Example 23 after chlorine corrosion test SEM photograph of a section of adjacent quartz glass in Comparative Example 21 ("Conspicuous" example of "sputtered state") after HF test

- ← The surface before the test
- ← Remained due to sputtering phenomenon
- ← The surface after the test

CORROSION-RESISTIVE MEMBERS

BACKGROUND OF THE INVENTION (1) Field of the Invention

The present invention relates to corrosion-resistive members having corrosion-resistive faces to be exposed to corrosive gases causing ion bombardment. The invention also relates to semiconductor-producing articles using such members as substrates.

(2) Related Art Statement

Following increased capacities in memory of super LSIs, finely working has been being progressing, so that processes requiring chemical reactions have been more widely used. Particularly, halogen-based gases such as chlorine-based gases and fluorine-based gases are used as a deposition gas, an etching gas or a cleaning gas in the semiconductor-producing apparatuses requiring a super clean state.

In the semiconductor-producing apparatus such as a hot CVD apparatus as a heater for heating a wafer in contact with such a corrosive gas, the semiconductor-cleaning gas of a halogen-based corrosive gas such as $ClF_3$, $NF_3$, $CF_4$, HF or HCl is used after the deposition. During the deposition, another halogen-based gas such as $WF_6$ or $SiH_2Cl_2$ is also used as a film-forming gas.

Since silicon nitride is a compound containing Si as a main component constituting wafers, silicon nitride as well as Si, $SiO_2$ and SiC are used for members in semiconductor-producing apparatuses, particularly chambers. NGK Insulators, Ltd. disclosed in JP-A 5-251365 that if a silicon nitride sintered body is exposed to a $ClF_3$ gas at high temperatures, its surface state changes to generate particles.

Silicon nitride members are exposed to various environments. For example, in case of etchers, corrosion of the members is accelerated with ion bombardment, or an ingredient in the member is sputtered with plasma ion bombardment, thereby causing pollution of the wafers. Since the design rule approaches 0.1 $\mu$m, such problems became more elicit than before.

SUMMARY OF THE INVENTION

It is an object of the present invention to provide a corrosion-resistive member comprising a corrosive-resistive face to be exposed to a corrosive gas causing ion bombardment, wherein a sintered body of silicon nitride is used as the corrosion-resistive face to enhance the corrosion resistance of this corrosion-resistive face.

The present invention relates to a corrosion-resistive member, comprising a corrosion-resistive face which is to be exposed to a corrosive gas causing ion bombardment, at least a part of said corrosion-resistive member comprising a sintered body of silicon nitride having an open porosity of not more than 5%, said silicon nitride sintered body constituting said corrosion-resistive face, said corrosion-resistive member having a characteristic that if two auxiliary planes are formed by cutting the corrosion-resistive member to intersect vertically with said corrosion-resistive face and to be located vertically to each other, said two auxiliary planes satisfy the following orientation index between said two auxiliary planes being not less than 0.8 and not more than 1.2, and the following orientation index between the corrosion-resistive face and each of the auxiliary faces being not less than 1.5.

Orientation index between the two auxiliary planes=$[Is1(320)/(Is1(320)+Is1(002))]/[Is2(320)/(Is2(320)+Is2(002))]$ wherein Is1(320) denotes an intensity of X-ray diffraction at a 320 face of β-type silicon nitride in one "Is1" of the auxiliary planes, Is1(002) denotes an intensity of X-ray diffraction at a 002 face of β-type silicon nitride in the auxiliary planes "Is1", Is2(320) denotes an intensity of X-ray diffraction at a 320 face of β-type silicon nitride in the other auxiliary plane "Is2", and Is2(002) denotes an intensity of X-ray diffraction at a 002 face of β-type silicon nitride in the auxiliary planes "Is2".

Orientation index between the corrosion-resistive face and each of the auxiliary planes=$[Im(320)/(Im(320)+Im(002))]/[Is(320)/(Is(320)+Is(002))]$ wherein Im(320) denotes an intensity of X-ray diffraction at a 320 face of β-type silicon nitride in the corrosion-resistive face "m", Im(002) denotes an intensity of X-ray diffraction at a 002 face of β-type silicon nitride in the corrosion-resistive face "m", Is(320) denotes an intensity of X-ray diffraction at a 320 face of β-type silicon nitride in the auxiliary plane "Is", and Is(002) denotes an intensity of X-ray diffraction at a 002 face of β-type silicon nitride in the auxiliary planes "Is".

Measurements are made according to the following condition.

Measurement instrument: Powdery X-ray diffractometer manufactured by Rigaku Denki
X rays: CuKα line
Tube voltage: 35 kV
Diffraction angle 2θ at I(320)=61.3°
Diffraction angle 2θ at I(320)=64.0°

In the above, for example, the intensity of X-ray diffraction at the 320 face of β type silicon nitride at the auxiliary face Is1 denotes a measurement value of the diffraction intensity at the 320 face of the β type silicon nitride when X rays are irradiated upon the auxiliary face Is1 according to a θ–2θ method.

These and other objects, features and advantages of the invention will be apparent from the following description of the invention when taken in conjunction with the attached drawings, with the understanding that some modifications, variations and changes could be easily made by the skilled person in the art to which the invention.

BRIEF DESCRIPTION OF THE DRAWINGS

For a better understanding of the invention, reference is made to the attached drawings, wherein.

DETAILED DESCRIPTION OF THE INVENTION

In the following, the present invention will be explained. The present inventors discovered that the corrosion resistance of the silicon nitride sintered body, and particularly its corrosion resistance against the halogen-based corrosion gas or a plasma thereof are conspicuously increased by controlling the orientation of the crystalline particles of silicon nitride constituting the silicon nitride sintered body to a specified state, so that the generation of particles is suppressed. The inventors reached the present invention based on this discovery.

Silicon nitride chrystallographically belongs to the hexagonal system, and has a toric crystalline structure. In other words, the c-axis direction is vertical to a toric, and the a- or b-axis direction is in parallel to the toric. As viewed from the exposing face of the silicon nitride sintered body, the higher the charged density in the c-axis direction, the larger is the diffraction intensity I(002) at the (002) plane at that face. As viewed from the exposing face of the silicon nitride sintered body, the higher the charged density in the a-axis or b-axis direction, the larger is the diffraction intensity I(032) at the (032) plane at that face.

Im(320) denotes the intensity of the X-ray diffraction at the (320) plane of the β-type silicon nitride at the corrosion-resistant face. Therefore, the larger the Im(320), the larger the charged density in the a-axis and/or b-axis direction. Im(002) denotes the intensity of the X-ray diffraction at the (002) plane in the β-type silicon nitride at the corrosion-resistant face. Therefore, the larger the Im(002), the larger the charged density in the c-axis direction.

Therefore, the above formula:[Im(320)/(Im(320)+Im(002))] denotes the rate of the charged density in the a-axis and/or b-axis direction as viewed from the corrosion-resistive face. [Is(320)/(Is(320)+Is(002))] denotes the rate of the charged density in the a-axis or b-axis direction as viewed from the auxiliary face.

Figure 1:
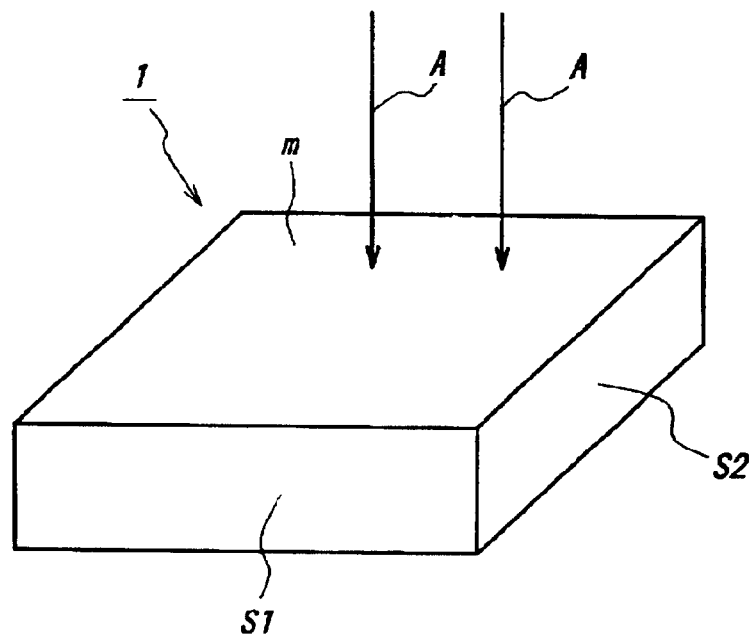
FIG. 1 is a schematic perspective view of a corrosion-resistive member according to the present invention.

Therefore, that the value of [Im(320)/(Im(320)+Im(002))]/[Is(320)/(Is(320)+Is(002))] is not less than 1.5 means that the charged density in the a-axis or b-axis direction is larger when viewed from the corrosion-resistive face "m" in FIG. 1 than as viewed from the auxiliary face. In this way, to increase the charged density in the a-axis or b-axis direction as viewed from the corrosion-resistive face "m" means that the toric crystalline structure is oriented preferentially vertically to the corrosion-resistive face "m".

The present inventors noted this point, and made studies thereon. As a result, they discovered that when the silicon nitride sintered body is being corroded while undergoing ion bombardment as shown by arrows A, the corrosion resistance is enhanced by orienting the toric crystalline structure preferentially vertically to the corrosion-resistive face.

The orientation index between the corrosion-resistive face and the auxiliary face is preferably not less than 2.5. No particular upper limit exists, but the corrosion member having the upper limit of not more than 10 is easy to produce.

One corrosion-resistive member may have two corrosion-resistive faces. As shown in FIG. 1, there are two auxiliary faces for the corrosion-resistive face "m", and the auxiliary faces s1 and s2 are orthogonal to each other. Therefore, [Im(320)/(Im(320)+Im(002))] is constant, but [Is(320)/(Is(320)+Is(002))] is not constant. However, according to the present invention, the value of [Im(320)/(Im(320)+Im(002))]/[Is(320)/(Is(320)+Is(002))] is not less than 1.5 for each of the auxiliary faces.

In the present invention, the silicon nitride sintered body has the orientation index between the two auxiliary faces s1 and s2 located vertically to each other being not less than 0.8 and not more than 1.2. In other words, this means that as viewed from a direction parallel to the corrosion-resistive face "m", there is substantially no orientation in the crystalline particles.

Plural combinations of two auxiliary faces s1 and s2 can be set for one corrosion-resistive face. However, according to the present invention, the above orientation index is 0.8 to 1.2 for any combination of the auxiliary faces s1 and s2.

Further, the present inventors noted the purity of the corrosion-resistive member. It is preferable to incorporate an element or elements (including lanthanoids) in Group 2a or 3a in the Periodic Table into the silicon nitride sintered body. These elements are considered to form stable halogen compounds. The lanthanoid elements include La, Ce, Pr, Nd, Pm, Sm, Eu, Gd, Tb, Dy, Ho, Er, Tm, Yb and Lu.

Particularly, elements having large atomic weights (heavy) are more preferable (Ca, Sr. Ba, Y and lanthanoid elements). When one or more elements from Group 2a and 3a are incorporated, die weight reduction of the corrosion-resistive member is reduced.

Among these elements, at least one element selected from the group consisting of calcium, strontium, barium, magnesium, yttrium and lanthanoid elements is more preferable. Further, at least one element selected from the group consisting of magnesium, yttrium, ytterbium, cerium, samarium and lanthanum is most preferable.

The elements in Groups 2a and 3a of the Periodic Table are most preferably incorporated in the form of oxides, but they may be incorporated in the form of elements themselves or nitrides.

In the silicon nitride sintered body, at least one element selected from the group consisting of the elements in Groups 2a and 3a of the Periodic Table is preferably incorporated in a total amount of 1 to 15 mol % externally relative to silicon nitride as calculated in the form of the metallic element(s). When the content is not less than 1 mol %, the excellent sintered body having a small porosity can be obtained, so that the function and effect in reducing the weight reduction due to corrosion as mentioned above become conspicuous. The incorporated amount is more preferably not less than 1.5 mol %.

In the silicon nitride sintered body, if the additive(s) is (are) too much, the so-called grain boundary phase is precipitated to such a level that it can be easily detected with XRD. Selective corrosion of the silicon nitride sintered body due to difference in etching rate between the grain boundary and the silicon nitride particles proceeds to cause contamination with particles or increase the sputtering probability with ion bombardment. In addition, the coefficient of thermal expansion increases, so that when the silicon nitride sintered boy is heated, the positional relation between the wafer deviates due to the difference in thermal expansion between the sintered body and the wafer. Thereby, the yield of devices may be decreased. For this reason, the content of one or more elements selected from the group consisting of the elements in Groups 2a and 3a of the Periodic Table is preferably not more than 15 mol % relative to 1 mol of $Si_3N_4$ as calculated in the form of the metallic element(s). The compounding amount thereof is more preferably not more than 12 mol %.

The content of elements other than Groups 2a and 3a in the Periodic Table is more preferably as small as possible. More specifically, the total content of the element(s) in Group 1 and element(s) in Groups 4a–3b of the Periodic Table is not more than 50 ppm.

The elements in Group 1a of the Periodic Table are Li, Na, K, Rb and Cs. The elements in Groups 4a–3b are Ti, Zr, Hf, V, Nb, Ta, Cr, Mo, W, Mn, Re, Fe, Ru, Ir, Ni, Pd, Pt, Ag, Au, Zn, Cd, Hg, B, Al, Ga, In and Tl.

It is known that the alkaline elements (Group 1a) and those in Group 4a afford adverse effects upon the wafer process. However, the present inventors found out that the elements such as, Al are unfavorable as the ingredients for the corrosion-resistive members. That is, if elements in Group 3b are incorporated into the silicon nitride sintered body, the element is likely to be sputtered and may be attached to the wafers upon receipt of ion bombardment. Such attachment may cause metal contamination or poor etching.

Sintering of silicon nitride as a sintering-difficult material is usually promoted by addition of around 1 to 3 wt % of Al component. The Al component is usually added to modify the silicon nitride crystals themselves, and is recognized as impurity in the starting material, and often added as a sintering aid. It is unexpected that such a component is unfavorable from the standpoint of the sputtering phenomenon.

There are generally two cases where the thermal conductivity of the silicon nitride sintered bodies is preferably higher or lower depending upon applications therefor. However, that the silicon nitride sintered body has a high heat conductivity means that the crystals of silicon nitride largely grow. If the silicon nitride crystals grow too much, they are likely to be oriented, but the corroded degree will become non-uniform, which will be a factor for generating particles. Therefore, it is preferable to not largely grow the crystals. For this purpose, the thermal conductivity is preferably not more than 50 W/m·K.

The corrosion-resistive member according to the present invention is not limited to any particular producing method. The member can be produced by the following method. That is, a raw material (mixed powder) is obtained by adding to powdery silicon nitride element(s) itself (themselves) in Group 2a and/or 3a or compound(s) thereof in a total amount of 1 to 15 mol % externally as calculated in the form of the metal element(s). This powdery raw material is fired under uniaxial pressurizing, while being surrounded with carbon having an ash amount of 0.5 wt % or less in an atmosphere of 1 to 5 atm (0.10–0.51 MPa) in $N_2$ pressure, thereby obtaining a fired body. The fired body is worked such that the pressurized face of the fired body may give a corrosion-resistive face, thereby obtaining a corrosion-resistive member.

The silicon nitride raw material is preferably of the α type. The α type can be easily obtained at a high purity. As a target, the total amount of elements in Groups 1a and 4a–3b is preferably not more than 500 ppm by weight, more preferably not more than 200 ppm by weight. The average particle diameter of the raw material is preferably not more than 1 μm.

Incorporation of a slight amount of chlorine or fluorine into the raw material is effective for making the sintered body more pure. Chlorine and/or fluorine is preferably contained in a total amount of 20 to 1000 ppm by weight. Neither chlorine nor fluorine is necessarily contained in the silicon nitride raw material. Such may be added as additive externally to the raw material.

The addition mode of the element(s) in Groups 2a and 3a may be appropriately selected, and their oxide powders are easily available. The addition amount of the element(s) in Groups 2a and 3a into the silicon nitride raw material powder is preferably 1 to 15 mol per 1 mol of silicon nitride $Si_3N_4$ as calculated in the form of the metal element(s). The orientation degree depends upon the kind(s) of the additive (s), and the elements in Groups 2a and 3a are preferably added. Particularly, $Y_2O_3$ is preferred from the standpoint of the orientation.

The raw material powder is mixed and granulated by appropriate ways, and molded by the mold pressing method, for example. The molded body is enclosed with a high purity carbon sheet, which is fired at about 1700 to 1900° C. under a $N_2$ pressure of 1 to 5 atm according to the hot press method.

By so doing, the sintered body having the orientation specified in the present invention can be obtained. Preferably, the sintered body contains 1 to 15 mol % of the element(s) in Groups 2a and 3a with the total content of the element(s) in Groups 1a and 4a–3b being not more than 50 ppm. In order to realize such a super high purity, it is effective to incorporate some halogen elements into the raw material or to enclose the molded body with a high-purity carbon sheet. A slight amount of high-purity activated carbon or the like is effectively incorporated into the molded body. After the sintered bodies are obtained, they are worked into desired shapes by various working methods such that their main planes may be exposed faces.

The carbonaceous member such as the carbon sheet or the activated carbon has preferably the ash content of not more than 0.5 wt %, more preferably not more than 10 ppm by weight.

The corrosion-resistive members according to the present invention are applicable to various articles. As such articles, mention may be made of electromagnetic wave transmission windows, high frequency electrode devices, high frequency plasma-generating tubes, and high frequency plasma-generating domes, for example. The corrosion-resistive member according to the present invention may be used as a substrate for a susceptor upon which a semiconductor wafer is placed. As such a susceptor, a ceramic electrostatic chuck, a ceramic heater and a high frequency electrode may be recited, for example. In addition, the corrosion-resistive members according to the present invention may be used as substrates for various semiconductor-producing apparatuses, including rings such as shadow rings, chamber liners, gas shower plates, nozzles, dummy wafers, lift pins for supporting semiconductor wafers, shower plates, etc.

The corrosive gases to which the corrosion-resistive members according to the present invention are exposed are not limited to any one, but the halogen-based corrosive gases are preferred. The chlorine-based or fluorine-corrosive gases or plasma thereof are particularly preferred. As the chlorine-based gases, $Cl_2$, $BCl_3$, $ClF_3$, and HCl may be recited. As the fluorine-based gases, $ClF_3$, $NF_3$, $CF_4$ and $WF_6$ may be recited.

EXAMPLES

Experiment 1

Examples 11 and Comparative Examples 11

To 100 wt. parts of α type powdery silicon nitride was added 3.5 mol % of powdery magnesia as calculated externally, and the resulting mixture was mixed in IPA (isopropyl alcohol). The silicon nitride powder had a specific surface area of 11 m²/g and the average particle diameter of 0.55 μm, and contained 10 ppm of K, 50 ppm of Na, 40 ppm of Ca, 45 ppm of Fe, 20 ppm of Cr, 40 ppm of Al, 60 ppm of F and 30 ppm of Cl. Magnesia had a grade of 99.9%.

The mixed powder was dried, non-crystalline fused, and press molded with a mold. The molded body was inserted into a carbon mold after being covered with a carbon sheet, which was subjected to hot press at 1800 C. in nitrogen at pressure of 2 atms (0.20 MPa). The keeping time was 6 hours, and the pressurizing pressure was 20 MPa. The carbon sheet was of graphite with an ash content of less than 10 ppm (Al<1 ppm, Ti<2 ppm, Mg<8 ppm and Co<1 ppm.

The resultant discoid sintered body (100 mm in diameter× 25 mm in thickness) had a pressurized face of the disc as a main plane, which was vertical to the pressing direction, the peripheral face A (i.e., vertical to the main face) being a non-pressurized face.

A test piece having dimensions of 10 mm in diameter×3 mm in thickness was cut out form the sintered body, and its thermal conductivity was measured by the laser flash method. At that time, the test piece was cut out such that its opposed end faces might be pressurized faces thereof. Another test piece having dimensions of 50 mm in diameter×1 mm in thickness was cut out from the sintered body, and subjected to measurement of a volume resistivity according to JIS C 2141. At that time, it was cut out such that the opposed end faces might be pressurized faces.

A slender transverse test bar having dimensions of 4 mm×3 mm×40 mm long was cut out from the sintered body, and subjected to measurement of four-point bending strength according to JIS R1601. Further, the density and the porosity of the sintered body were measured by the Archimedes method. The average coefficient of linear thermal expansion of the sintered body in a temperature range of 40 to 1000° C. was determined through measurements. The contents of the elements in Group 1 a, the elements in Groups 4a–3b, Fe and Cl were measured according to the chemical analysis method. Further, each orientation index was measured according to the X-ray diffraction method.

In each measurement for the four-point bending strength, density, porosity, coefficient of linear thermal expansion, the content of the elements in Group 1a, the content of the elements in Groups 4a–3b, that of Fe and that of Cl and the orientation indexes, a bar-shaped sample having a rectangular sectional shape was cut out from the sintered body such that its faces (side faces) in four longitudinal directions might include both the corrosion-resistive face and the auxiliary faces.

The discoid sintered body was cut to obtain a planar test piece having dimensions of 20 mm long, 20 mm wide and 2 mm thick, which was subjected to a corrosion test. At that time, the test piece 1 of FIG. 1 in Example 11 had a main face as a corrosion-resistive face "m", which was exposed to a corrosive gas A. In Comparative Example 11, the test piece 1 had the side face as a corrosion-resistive face "m", which was exposed to the corrosive gas. In each test piece, the orientation index between the corrosion-resistive face "m" and the auxiliary face and that between the auxiliary faces s1 and s2 were measured according to the above-mentioned condition.

The corrosion test was effected with each of the fluorine-based gas and the chlorine-based gas. In the test with the fluorine-based gas, each of $NF_3$ gas and Ar was flown at 100 sccm (chamber pressure:0.1 torr), and converted to plasma with inductively coupled plasma (ICP) (13.56 MHz, 800 W). While a bias power was applied to a 200 mm-diameter sample stage at 13.56 MHz and 300 W, ion bombardment was applied thereto. The test piece was placed on the sample stage. At that time, the temperature of the stage was about 350° C., and the bias voltage Vdc was about 400 V. The measured weight reduction due to the corrosion with $NF_3$ was divided by the density of the sintered body, which was calculated in the form of a corrosion speed ($\mu$m/hr) unit. Consequently, when the pressurized face (main face) was the corrosion-resistive face, the result was about 9 $\mu$m/hr (Example 11), and when the auxiliary face was an exposed face, it was 17 $\mu$m/hr (Comparative Example 11), which is about twice of the former result.

A silicon wafer was used as a comparative sample, which was subjected to a corrosion-withstanding test in the same manner as mentioned above. As a result, the weight reduction due to the corrosion with $NF_3$ was about 30 $\mu$m/hr.

In the corrosion-withstanding test with the chlorine-based gas, each of $Cl_2$ gas 300 sccm and Ar 100 sccm was flown (chamber pressure:0.1 torr), and converted to plasma with inductively coupled plasma (ICP) (13.56 MHz, 800 W). While a bias power was applied to a sample stage at 13.56 MHz and 300 W, ion bombardment was applied thereto. The test piece was placed on the sample stage. At that time, the temperature of the stage was about 200° C., and the bias voltage Vdc was about 300 V. The measured weight reductions due to the corrosion with $Cl_2$ were compared as in the same way as above. Consequently, when the pressurized face (main face) was the corrosion-resistive face, the weight reduction due to the corrosion with $Cl_2$ was 1.8 $\mu$m/hr (Example 11), and when the side face was the corrosion-resistive face, it was about 4 $\mu$m/hr (Comparative Example 11). The weight reduction of the silicone wafer due to the corrosion with $Cl_2$ was 100 $\mu$m/hr.

TABLE 1

|  | Unit | Example 11 | Comparative Example 11 | Example 21 | Example 22 | Example 23 | Example 24 |
|---|---|---|---|---|---|---|---|
| Adhesive (as metal element) | mol % | Mg: 3.5 | Auxiliary face in Example 11 exposed | Y: 1.8 | Y: 5 | Y: 3 | Ce: 8.1 |
| Firing temperature | ° C. | 1800 | | 1900 | 1900 | 1900 | 1750 |
| Porosity | % | 0 | | 0 | 0 | 0 | 0 |
| Density | g/cm³ | 3.18 | | 3.20 | 3.22 | 3.52 | — |
| Orientation index between corrosion-resistive face and auxiliary face | | 1.55 | | 3.16 | 3.19 | 3.01 | 2 |
| Orientation index between two auxiliary faces | | 0.99 | | 1.02 | 0.99 | 0.98 | 1.1 |
| Coefficient of thermal expansion | ppm/° C. | 3.1 | | 3.1 | 3.2 | 3.4 | 3.3 |
| Thermal conductivity | W/mK | 30 | | 37 | 40 | 45 | 33 |
| Four-point bending strength | MPa | 890 | | 790 | 720 | 780 | 900 |
| Volume resistivity | Ωcm | >1E + 16 | | 2.E + 15 | >1E + 16 | 1.E + 07 | — |
| Content of elements in Group Ia in sintered body | Wt ppm | 3 | | 2 | 6 | 2 | 9 |
| Content of elements in Group 4a–3b | Wt ppm | 34 | | 16 | 25 | 14 | 18 |
| Content of F | Wt ppm | 2 | | <1 | <1 | <1 | <1 |
| Content of Cl | Wt ppm | 66 | | 33 | 35 | 63 | 59 |
| Weight reduction due to corrosion with $NF_3$ | $\mu$m/hr | 9 | 17 | 1.5 | 1.5 | 3 | 9 |

TABLE 1-continued

|  | Unit | Example 11 | Comparative Example 11 | Example 21 | Example 22 | Example 23 | Example 24 |
|---|---|---|---|---|---|---|---|
| $NF_3$ corroded state | μm/hr | condensed | — | conspicuous | conspicuous | conspicuous | conspicuous |
| $NF_3$ sputtered state |  | good | — | good | good | good | good |
| Weight reduction due to corrosion with C12 | μm/hr | 1.8 | 4 | 0.9 | 1.7 | 1 | 0.9 |
| C12 corroded state |  | condensed | — | conspicuous | conspicuous | conspicuous | conspicuous |

Experiment 2

Examples 21–26 and Comparative Examples 21–23

Each sintered body was produced in the same manner as in Experiment 1. Instead of magnesia, yttria, ytterbia, ceria, samarium oxide, lanthane oxide and zirconia were added externally. The addition amounts, the firing temperature, etc. are shown in Tables 1 and 2.

A planar test piece having dimensions of 20 mm long, 20 mm width and 2 mm thick was cut out from each of the resulting discoid sintered bodies (100 mm in diameter×25 mm in thickness). The pressurized face (main face of the disc) of the test piece was taken as a corrosion-resistive face, and side faces (vertical to the main face) were taken as auxiliary faces.

Corrosion-withstanding tests were effected in the same manner as in Experiment 1, and the corroded state as well as the corrosion speed were evaluated through observation with the scanning type electron microscope. The additive(s) condensed at the corroded face, which is classified as "condensed". Test pieces in which the concentration of the additive(s) was lower than that before the test or no metallic element other than silicon was detected were classified as "not condensed".

Figure 2:
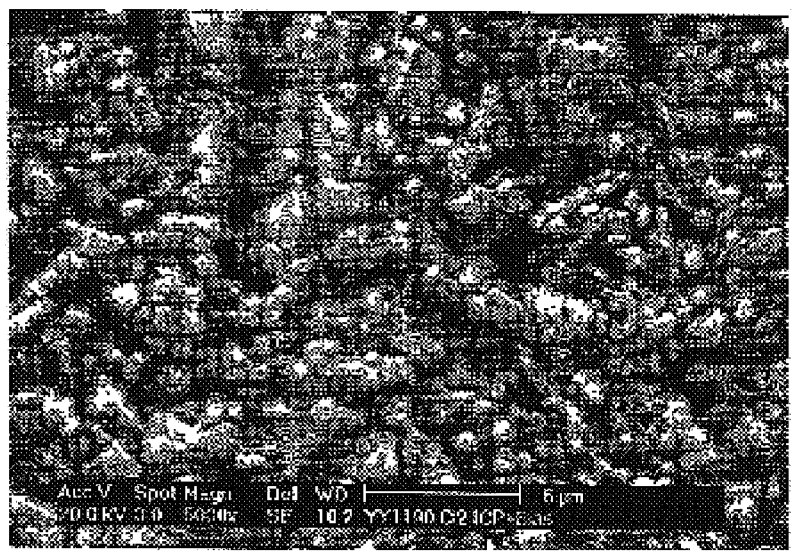
FIG. 2 is a scanning type electron micrograph of a surface of a test piece in Example 23 after being exposed to a corrosion-withstanding test with chlorine-based gas.

For example, the surface of test piece in Example 23 subjected to the corrosion-withstanding test with a chlorine-based gas was observed with the scanning type electron microscope, and the result is shown in FIG. 2. Fusion occurred among corroded products. It is considered that this fusion decreased the corrosion speed.

Further, the "sputtered state" was evaluated in the corrosion-withstanding test. Adjacent to the test piece was placed a quartz glass piece having the same size of the test piece, and they were exposed to ion bombardment with $NF_3$+Ar under the same condition as in the corrosion-withstanding test. If any additive or impurity is sputtered, etching of the quartz glass is hindered, so that only portions which are hindered from being etched in the quartz glass piece remain in the form of columns (Columnar non-corroded portions remain). After the exposure, the quartz glass was observed with the scanning type electron microscope to check the non-corroded portions. The test pieces in which non-corroded portions were not observed were judged as "good", and those in which such non-corroded portions were slightly observed were judged as "slight", while those in which such non-corroded portions were easily observed were judged as "conspicuous".

Figure 3:
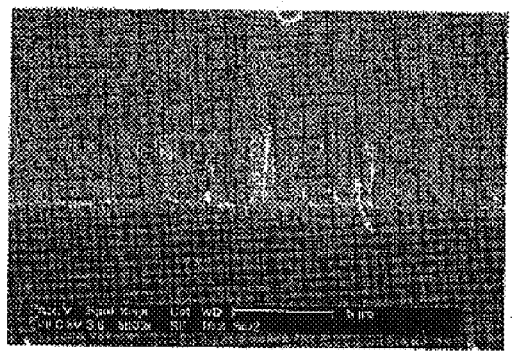
FIG. 3 is a scanning type electron micrograph a sectional surface of a quartz glass piece adjacent to the test piece in Comparative Example 21 after being exposed to $NF_3$.

FIG. 3 shows a scanning type electron microgram of a sectional face of the quartz glass piece placed adjacent to the test piece in Comparative Example 21. In FIG. 3, corrosion vertically proceeded in the test piece. Non-corroded portions were vertically formed in the form of columns in the quartz glass according to this microgram, which means that sputtering occurred.

TABLE 2

|  | Unit | Example 25 | Example 26 | Comparative Example 21 | Comparative Example 22 | Comparative Example 23 | Comparative Example 31 |
|---|---|---|---|---|---|---|---|
| Adhesive (as metal element) | mol % | Sm: 4 | La: 5.2 | Y: 5 and Al: 3.5 | Y: 0.5 | Zr: 4.5 and Al: 8.2 | Si: 20 |
| Firing temperature | °C. | 1850 | 1850 | 1750 | 1900 | 1750 | 2000 |
| Porosity | % | 1 | 0 | 0 | 8 | 2 | 1 |
| Density | g/cm$^3$ | 3.19 | 3.22 | — | 3.11 | 3.20 | 3.12 |
| Orientation index between corrosion-resistive face and auxiliary face |  | 2.5 | 2.7 | 1.7 | 1.2 | 1.1 | 1.3 |
| Orientation index between two auxiliary faces |  | 1.03 | 0.99 | 1.04 | 1.03 | 0.98 | 1.02 |
| Coefficient of thermal expansion | ppm/° C. | 3.3 | 3.3 | 3.4 | 3.1 | — | 3 |
| Thermal conductivity | W/mK | 26 | 31 | 25 | 12 | — | — |
| Four-point bending strength | MPa | 700 | 730 | 750 | 620 | 560 | 600 |
| Volume resistivity | Ωcm | — | — | — | 1.0E ± 16 | — | — |
| Content of element in Group Ia in sintered body | Wt ppm | 2 | 3 | 40 | 10 | 9 | about 600 |
| Content of element in Group 4a–3b | Wt ppm | 22 | 35 | about 50000 | 43 | about 30000 | 230 |
| Content of F | Wt ppm | <1 | <1 | — | — | — | — |
| Content of Cl | Wt ppm | 35 | 43 | — | — | — | — |
| Weight reduction due to corrosion with $NF_3$ | μm/hr | 5 | 4 | 11 | 22 | 20 | 20 |

TABLE 2-continued

|  | Unit | Example 25 | Example 26 | Comparative Example 21 | Comparative Example 22 | Comparative Example 23 | Comparative Example 31 |
|---|---|---|---|---|---|---|---|
| NF₃ corroded state | μm/hr | conspicuous | conspicuous | conspicuous | slight | slight | not condensed |
| NF₃ sputtered state |  | good | good | conspicuous | good | conspicuous | ** |
| Weight reduction due to corrosion with Cl2 | μm/hr | 0.8 | 1.2 | 23 | 18 | 30 | 30 |
| Cl2 corroded state |  | conspicuous | conspicuous | conspicuous | slight | slight | not condensed |

Experiment 3

Comparative Example 31

In order to make comparison with Experiments 1 and 2, a system in which only silica was added in a silicon nitride raw material was examined. This system was sintered by the capsule HIP (Hot Isostatic Press) method. The pressure was 200 MPa on firing. A test piece was cut out such that a pressurized face might be a corroded face, and was evaluated in the same manner as in Experiment 2. As a result, no highly purified effect by sintering was recognized, and purity was reversely dropped.

In each of Examples and Comparative Examples, the crystalline system of silicon nitride was the β type. Even if the hot press method is employed, the orientation degrees are not necessarily identical, and vary depending upon the kinds of the additives. It is seen that addition of the elements in Groups 2a and 3a (including lanthanoids) is preferred. The orientation index between the two auxiliary faces is near 1 in all of Examples and Comparative Examples, which means that they are substantially non-oriented. When the orientation index between the corrosion-resistive face and the auxiliary face was not less than 1.5, the corrosion-withstanding of the test piece was remarkably improved, and the weight reduction due to the corrosion decreased.

The amount of the impurities in the sintered body is smaller than that contained in the raw material, which shows that the purity of the sintered body is increased according to the present invention. The reason why the purity is increased is not necessary clear, but it is considered that an appropriate amount of fluorine or chlorine in the silicon nitride raw material reacts with the metal element(s) to form a halide, which is evaporated during firing. Further, since the carbon sheet covering the molded body has higher reactivity than that of carbon used as a molding material, it is considered that the purity is increased through the reaction between the carbon and the impurities. Specifically, when the carbon sheet having the ash content of over 0.5 wt % was used, such a purity-increasing effect was not recognized.

Experiment 4

A focus ring and a dummy wafer for a wafer having a diameter of 6 inches were produced by using the material in Example 21. Each of them was mechanically worked such that its corrosion-withstanding face to be exposed might be a hot pressed face. The products were subjected to the corrosion-withstanding test as in the above Experiments. Then, it was confirmed that the same results as in the test piece of Example 21 were obtained.

As mentioned above, according to the present invention, the corrosion-resistive member, which comprises the corrosion-resistive face to be exposed to the corrosive gas causing ion bombardment, uses the silicon nitride sintered body as the corrosion-resistive face, so that the corrosion-resistance of this corrosion-resistive face can be improved.

What is claimed is:

1. A corrosion-resistive member having a corrosion-resistive face which is exposed to a corrosive gas causing ion bombardment, wherein at least a part of said corrosion-resistive member comprises a sintered silicon nitride body having an open porosity of not more than 5%, wherein the total content of elements in Group Ia and Groups 4a–3b of the Periodic Table present in said sintered silicon nitride body is not more than 50 ppm by weight, and wherein said sintered silicon nitride body constitutes said corrosion-resistive face;

wherein if two auxiliary planes are formed by cutting said corrosion-resistive member to intersect vertically with said corrosion-resistive face and to be located vertically with respect to each other, an orientation index between said two auxiliary planes is in a range of 0.8 to 1.2, and an orientation index between said corrosion-resistive face and each of said auxiliary faces is not less than 1.5;

wherein said orientation index between the two auxiliary planes satisfies the following formula:

$$[Is1(320)/(Is1(320)+Is1(002))]/[Is2(320)/(Is2(320)+Is2(002))];$$

wherein $Is1(320)$ denotes an intensity of X-ray diffraction at a 320 face of β-type silicon nitride in one "Is1" of the auxiliary planes; $Is1(002)$ denotes an intensity of X-ray diffraction at a 002 face of β-type silicon nitride in the auxiliary planes "Is1"; $Is2(320)$ denotes an intensity of X-ray diffraction at a 320 face of β-type silicon nitride in the other auxiliary plane "Is2"; and $Is2(002)$ denotes an intensity of X-ray diffraction at a 002 face of β-type silicon nitride in the auxiliary planes "Is2"; and wherein said orientation index between said corrosion-resistive face and each of said auxiliary planes satisfies the following formula:

$$[Im(320)/(Im(320)+Im(002))]/[Is(320)/(Is(320)+Is(002))];$$

wherein $Im(320)$ denotes an intensity of X-ray diffraction at a 320 face of β-type silicon nitride in the corrosion-resistive face "m"; $Im(002)$ denotes an intensity of X-ray diffraction at a 002 face of β-type silicon nitride in the corrosion-resistive face "m"; $Is(320)$ denotes an intensity of X-ray diffraction at a 320 face of β-type silicon nitride in the auxiliary plane "Is"; and $Is(002)$ denotes an intensity of X-ray diffraction at a 002 face of β-type silicon nitride in the auxiliary planes "Is".

2. The corrosion-resistive member set forth in claim 1, wherein one or more metal elements selected from Group 2a and Group 3a in the Periodic Table are present in a total amount of 1 to 15 mol % in said sintered silicon nitride body as calculated externally in the form of the metal elements relative to said silicon nitride.

3. The corrosion-resistive member set forth in claim 2, wherein said sintered silicon nitride body further comprises one or more elements selected from the group consisting of calcium, strontium, barium, magnesium, yttrium and lanthanoid elements.

4. The corrosion-resistive member set forth in claim 3, wherein said sintered silicon nitride body comprises one or more elements selected from the group consisting of magnesium, yttrium, cerium, samarium and lanthanum.

5. The corrosion-resistive member set forth in claim 2, wherein at least one of said one or more metal elements selected from Group 2a and Group 3a in the Periodic Table is in the form of an oxide.

6. The corrosion-resistive member set forth in claim 1, wherein said corrosive-resistive member has a thermal conductivity of 50 W/m·K or less.

7. The corrosion-resistive member set forth in claim 1, wherein said corrosive gas is a halogen-based corrosive gas or a plasma or said halogen-based corrosive gas.

8. A semiconductor-producing article comprising a substrate comprising said corrosion-resistive members set forth in claim 1.

* * * * *

UNITED STATES PATENT AND TRADEMARK OFFICE
CERTIFICATE OF CORRECTION

PATENT NO. : 6,749,930 B2
DATED : June 15, 2004
INVENTOR(S) : Tsuneaki Ohashi

It is certified that error appears in the above-identified patent and that said Letters Patent is hereby corrected as shown below:

<u>Column 4,</u>
Line 65, delete "Group 4a" and add -- Groups 4a-3b -- after "in"

<u>Column 14,</u>
Line 8, delete the second occurrence of "or" and add -- of -- after "plasma"

Signed and Sealed this

Sixteenth Day of November, 2004

JON W. DUDAS
*Director of the United States Patent and Trademark Office*